(12) United States Patent
Kim et al.

(10) Patent No.: US 8,395,155 B2
(45) Date of Patent: Mar. 12, 2013

(54) THIN FILM TRANSISTORS HAVING AN ADDITIONAL FLOATING CHANNEL AND METHODS OF MANUFACTURING THE SAME

(75) Inventors: Eok-su Kim, Seongnam-si (KR); Sang-yoon Lee, Seoul (KR); Myung-kwan Ryu, Yongin-si (KR); Kyung-bae Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/929,453

(22) Filed: Jan. 26, 2011

(65) Prior Publication Data
US 2011/0180803 A1     Jul. 28, 2011

(30) Foreign Application Priority Data

Jan. 26, 2010 (KR) .................. 10-2010-0007078
Jan. 17, 2011 (KR) .................. 10-2011-0004535

(51) Int. Cl.
*H01L 29/10* (2006.01)

(52) U.S. Cl. .................. 257/59; 257/213; 257/E21.414; 438/149

(58) Field of Classification Search ............. 257/59, 257/213, E21.414; 438/149
See application file for complete search history.

(56) References Cited

U.S. PATENT DOCUMENTS

| | | | |
|---|---|---|---|
| 5,917,199 A * | 6/1999 | Byun et al. | 257/59 |
| 7,242,039 B2 | 7/2007 | Hoffman et al. | |
| 2009/0001432 A1 | 1/2009 | Kim et al. | |
| 2009/0057663 A1 | 3/2009 | Kim et al. | |
| 2009/0224238 A1 | 9/2009 | Kim et al. | |
| 2010/0133531 A1* | 6/2010 | Akimoto et al. | 257/43 |

FOREIGN PATENT DOCUMENTS

| | | |
|---|---|---|
| JP | 2008294402 A | 12/2008 |
| JP | 2009141001 A | 6/2009 |
| KR | 20080102029 A | 11/2008 |
| KR | 20090106051 A | 10/2009 |

* cited by examiner

*Primary Examiner* — Howard Weiss
*Assistant Examiner* — Steven Rao
(74) *Attorney, Agent, or Firm* — Harness, Dickey & Pierce, P.L.C.

(57) ABSTRACT

Thin film transistors (TFTs) and methods of manufacturing the same. A TFT may include a floating channel on a surface of a channel and spaced apart from a source and a drain, and an insulating layer formed on the floating channel and designed to determine a distance between the floating channel and the source or the drain.

30 Claims, 4 Drawing Sheets

THIN FILM TRANSISTORS HAVING AN ADDITIONAL FLOATING CHANNEL AND METHODS OF MANUFACTURING THE SAME

CROSS-REFERENCE TO RELATED APPLICATIONS

This application claims priority under 35 U.S.C. §119 to Korean Patent Application Nos. 10-2010-0007078 filed on Jan. 26, 2010, and 10-2011-0004535, filed on Jan. 17, 2011, each filed in the Korean Intellectual Property Office (KIPO), the disclosures of each incorporated herein in their entirety by reference.

BACKGROUND

1. Field

Example embodiments relate to thin film transistors (TFTs) and methods of manufacturing the same.

2. Description of the Related Art

Thin film transistors (TFTs) are used in various devices. For example, TFTs may be used as switching and driving devices in display devices, and as select switches in cross-point memory devices.

Amorphous silicon (a-Si) TFTs may be used as driving and switching devices in display devices. The most widely used TFTs may be a-Si TFTs, which may be uniformly formed on a large substrate with a size greater than 2 m at low cost. As display devices increase in size and quality, the performance of TFTs may be required to increase. However, there may be a limitation in using existing a-Si TFTs due to their mobility of about 0.5 $cm^2/Vs$. Also, in general, since a-Si TFTs undergo processes at a high temperature of about 300° C., it may be difficult to apply a-Si TFTs to low temperature substrates, for example polymer substrates, for manufacturing flexible display devices.

Accordingly, various TFTs which may replace a-Si TFTs have been developed. Because polycrystalline silicon thin film transistors (poly-Si TFTs) may have high mobility on the order of tens to hundreds of $cm^2/Vs$, poly-Si TFTs may be applied to high quality display devices in which it is difficult to apply existing a-Si TFTs. Further, poly-Si TFTs may suffer less characteristic degradation than a-Si TFTs. However, it is difficult to make poly-Si TFTs larger because of manufacturing equipment limitations and/or technical issues (e.g., poor uniformity).

It may be easy to make oxide semiconductor TFTs larger because an oxide semiconductor is amorphous. Further, oxide semiconductor TFTs have a higher mobility than a-Si TFTs. However, electrical characteristics of oxide semiconductor TFTs may change due to external factors, for example, damage, moisture and/or oxygen adsorption.

When compared with existing silicon TFTs, organic TFTs (OTFTs) may be manufactured at low cost because. An organic semiconductor layer may be formed by a wet process rather than by plasma-enhanced chemical vapour deposition (PECVD), and OTFTs may be manufactured by using a roll-to-roll process using a plastic substrate if necessary. However, OTFTs may have a lower charge mobility and a higher leakage current than silicon TFTs.

SUMMARY

Example embodiments may provide thin film transistors (TFTs) and methods of manufacturing the same.

According to example embodiments, a TFT includes a source, a drain, a channel formed between the source and the drain, and a floating channel formed over or under the channel to be spaced apart from the source and the drain.

The TFT may further include a gate formed on a substrate to correspond to the channel. The TFT may further include a gate insulating layer formed between the gate and the channel. The TFT may further include an insulating layer formed on the floating channel. At least one of the source and the drain may contact end portions of the channel and the insulating layer. A distance between the floating channel and the source or between the floating channel and the drain may be equal to a thickness of the insulating layer. The TFT may further include a gate insulating layer formed between the gate and the channel. The channel may include an oxide.

The floating channel, the source, and the drain may be formed of the same conductive material. The floating channel may be formed of one of a metal, a metal alloy, a metal oxide, an intermetallic compound, a conductive polymer, an impurity-doped semiconductor, carbon nanotubes, and graphene, or a combination thereof. A resistance of the floating channel may be less than a resistance of the channel when the channel is turned on.

According to other example embodiments, a TFT includes a source, a drain, a channel formed between the source and the drain, a gate formed on a substrate to correspond to the channel, an insulating layer formed between the gate and the channel, and a floating channel formed over or under the channel to be spaced apart from the source and the drain. The floating channel allows carriers to move smoothly, to make the TFT efficient.

The TFT may further include an insulating layer formed on the floating channel. At least one of the source and the drain may contact end portions of the channel and the insulating layer. A distance between the floating channel and the source or the drain may be equal to a thickness of the insulating layer. The channel may include an oxide. The floating channel, the source, and the drain may be formed of the same conductive material. A resistance of the floating channel may be less than a resistance of the channel when the channel is turned on.

According to still other example embodiments, a method of manufacturing a TFT includes forming a gate and a gate insulating layer on a substrate, forming a channel on the gate insulating layer, forming a conductive layer to cover the gate insulating layer and the channel, and forming a source and a drain to contact both side portions of the channel, and forming a floating channel to be spaced apart from the source and the drain.

The floating channel, the source, and the drain may be formed of the same conductive material, and may be formed by using the same patterning process. The method may further include an insulating layer formed between the floating channel, and the source and the drain.

According to yet other example embodiments, a thin film transistor includes a source, a drain, a channel between the source and drain and a floating channel on the channel, the floating channel spaced apart from the source and drain. According to yet still other example embodiments, a thin film transistor includes a substrate, a source and drain on the substrate, a channel between the source and the drain, a gate on the channel, an insulating layer between the gate and the channel, and between the gate and the source and the drain and a floating channel on the channel spaced apart from the source and the drain, a charge carrier mobility in the floating channel greater than a charge carrier mobility in the channel. According to yet still other example embodiments, a method of manufacturing a TFT includes forming a gate and a gate insulating layer on a substrate, forming a channel on the substrate, the channel separated from the gate by gate insulating layer, forming a conductive layer to cover the gate insulating layer and the channel, forming a source and drain to contact two side regions of the channel and forming a floating channel on the channel spaced apart from the source and the drain.

BRIEF DESCRIPTION OF THE DRAWINGS

Example embodiments will be more clearly understood from the following brief description taken in conjunction with the accompanying drawings. FIGS. 1-3 represent non-limiting, example embodiments as described herein.

FIG. 1 is a cross-sectional diagram illustrating thin film transistors (TFTs) according to example embodiments;

FIG. 3 is a cross-sectional diagram illustrating TFTs according to other example embodiments.

Figure 1:
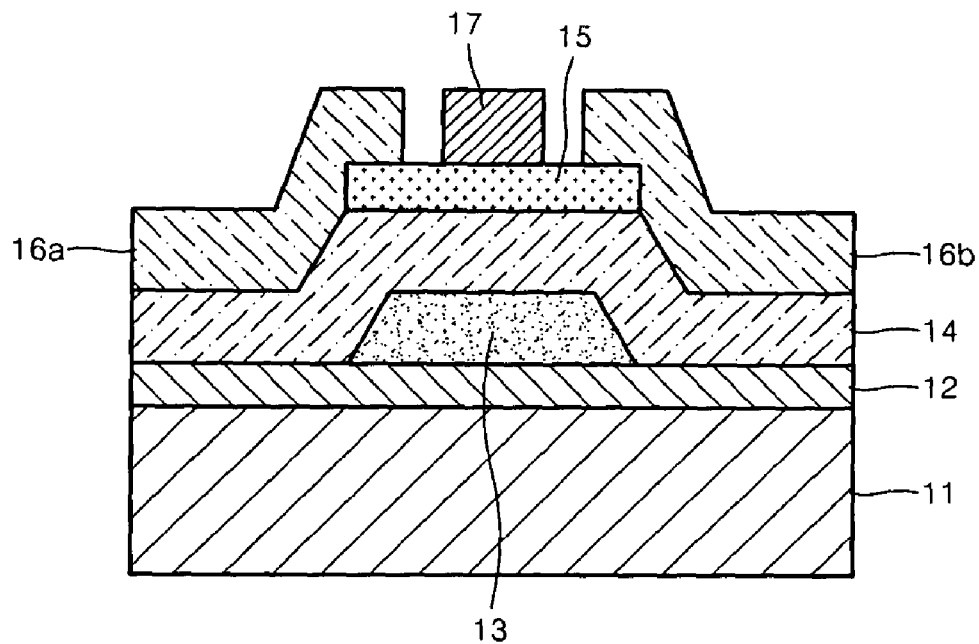

These figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram illustrating thin film transistors (TFTs) according to example embodiments. Although a TFT illustrated in FIG. 1 is illustrated as a bottom gate structure, example embodiments are not limited to bottom gate TFTs. TFTs according to example embodiments may be various configurations. For example, example embodiments may include top gate TFTs. Referring to FIG. 1, a TFT may include a gate 13 at least partially on a substrate 11. A gate insulating layer 14 may be on the substrate 11 and the gate 13. A channel 15 may be on the gate insulating layer 14 corresponding to (e.g., aligned with) the gate 13. A source 16a and a drain 16b may be on the gate insulating layer 14 and on two side regions (e.g., ends) of the channel 15. A floating channel 17 may be on a surface of the channel 15 spaced apart from the source 16a and the drain 16b.

The substrate 11 may be, for example, a semiconductor substrate, an insulating substrate, and/or a conductive substrate. The substrate 11 may be a substrate used in a general semiconductor device, for example, silicon, glass, and/or an organic material. An oxide layer 12 may be on a surface of the substrate 11 (e.g., a silicon substrate 11). For example, the oxide layer 12 may include a dry and/or wet thermal oxide (e.g., $SiO_2$). The gate 13 may be a conductor. The gate 13 may include a conductive material, for example, a metal and/or a conductive oxide. A gate metal may include, for example, titanium (Ti), platinum (Pt), ruthenium (Ru), gold (Au), silver (Ag), molybdenum (Mo), aluminum (Al), tungsten (W), and/or copper (Cu). A gate conductive oxide may include, for example, InZnO (IZO) and/or AlZnO (AZO). The gate insulating layer 14 may be an insulator including an insulating material. For example, the insulating layer 14 may include a high-K material (e.g., a material with a higher dielectric constant than $SiO_2$). The gate insulating layer 14 may include $HfO_2$, $Al_2O_3$ and/or $Si_3N_4$.

The channel 15 may be a semiconductor and may include a general semiconductor material. For example, the channel may include an oxide semiconductor, an organic semiconductor, any III-V semiconductors (e.g., Si, Ge, SiGe, GaN, GaAs, InSb, InP, and/or CdS), carbon nanotubes, and/or graphene. The source 16a and the drain 16b may be conductors and may include a conductive material. For example, the source 16a and the drain 16b may be a metal (e.g., Ti, Pt, Ru, Au, Ag, Mo, Al, W, and/or Cu) and/or a conductive oxide (e.g., InZnO (IZO) and/or AlZnO (AZO)). The floating channel 17 may be a conductor and may include a general conductive material. The floating channel 17 may be a same material as that of the source 16a and/or the drain 16b. For example, the floating channel 17 may include a metal, an alloy, a metal oxide (e.g., indium tin oxide (ITO) and/or indium zinc oxide (IZO)), an intermetallic compound, a conductive polymer, an impurity-doped semiconductor, carbon nanotubes, and/or graphene.

Two side regions of the channel 15 may be in contact with the source 16a and the drain 16b. Side regions of the floating channel 17 may be spaced apart from the source 16a and the drain 16b (e.g., the floating channel 17 may not contact the source 16a and the drain 16b). It may be unnecessary to separately adjust an off state of the floating channel 17. According to example embodiments, a resistance of the floating channel 17 may be lower than a resistance of the channel 15 when the channel 15 is turned on (e.g., when the TFT is in an on state). Carriers may predominantly move through the floating channel 17 due to the lower resistance. An efficiency of a TFT according to example embodiments may be improved and/or increased over a TFT without a floating channel (e.g., without a floating channel 17).

For example, a TFT may include a channel 15 of an oxide material. Because of oxide semiconductor characteristics, an electric field between a source and a drain may increase as a length of the channel decreases, and a threshold voltage Vth of a TFT may be shifted to a negative value, thereby exceeding a general TFT driving range. In order to prevent and/or reduce this problem, the length of the channel of the TFT may be increased. If the length of the channel is increased, an ON current 'Ion' of the TFT may be reduced. According to example embodiments, because the resistance of a floating channel 17 may be lower than that of the channel 15 when the channel 15 is in an on-state, current may not be reduced as a channel length of an oxide TFT is increased. A positive threshold value of a TFT may be obtained for an increased or maintained length of a channel 15 as compared to a TFT without a floating channel. A high and/or improved current and a high and/or improved mobility may be obtained. An effective channel length may be reduced. For reference, a length of a channel may refer to a distance between the source 16a and the drain 16b.

As another example, a TFT may include a channel 15 of an organic material. An organic semiconductor layer of the channel 15 may be formed by, for example, using a general printing process. Due to resolution limits of a printing process a reduction in channel length may not be possible. An ON current 'Ion' of the TFT may be maintained and/or reduced. According to example embodiments including a TFT with an organic channel 15 and a floating channel 17, because the resistance of the floating channel 17 may be low, a current may not be reduced as a length of the channel 15 of the organic TFT is increased, and a high and/or improved current may be obtained.

Figure 2A:
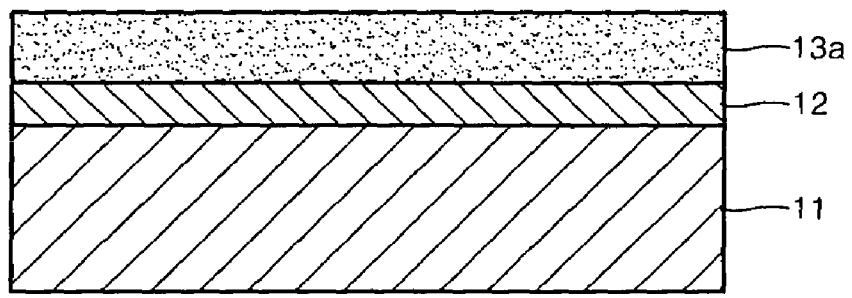
FIGS. 2A-2E are cross-sectional diagrams illustrating methods of manufacturing TFTs according to example embodiments.

FIGS. 2A-2E are cross-sectional diagrams illustrating methods of manufacturing a TFT of FIG. 1 according to example embodiments. Referring to FIG. 2A, a substrate 11 may be prepared. The substrate 11 may be, for example, silicon, glass, and/or plastic. However, example embodiments are not limited thereto and other substrates are contemplated. If the substrate 11 is silicon, an insulating layer 12 (e.g., $SiO_2$) may be formed on a surface of the substrate 11. For example, the insulating layer 12 may be formed by thermal oxidation. A conductive material 13a, for example a metal and/or a conductive metal oxide, may be applied to the substrate 11 and/or the insulating layer 12.

Figure 2B:
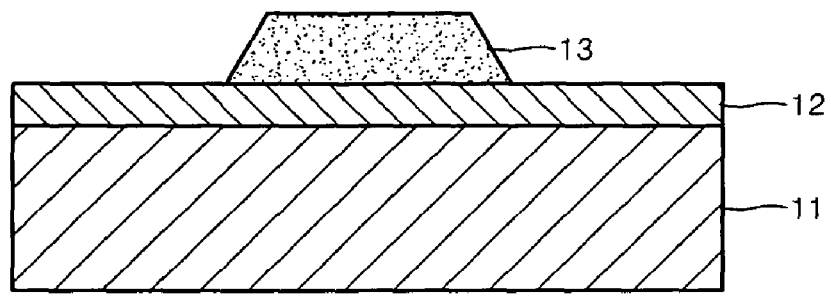
Figure 2C:
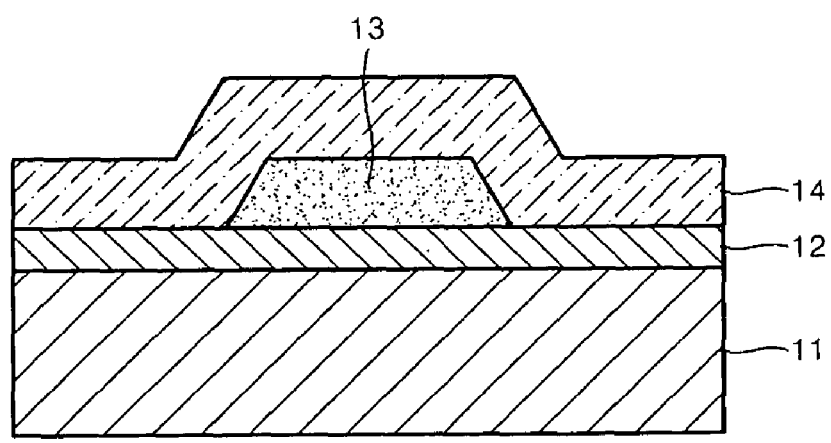
Figure 2D:
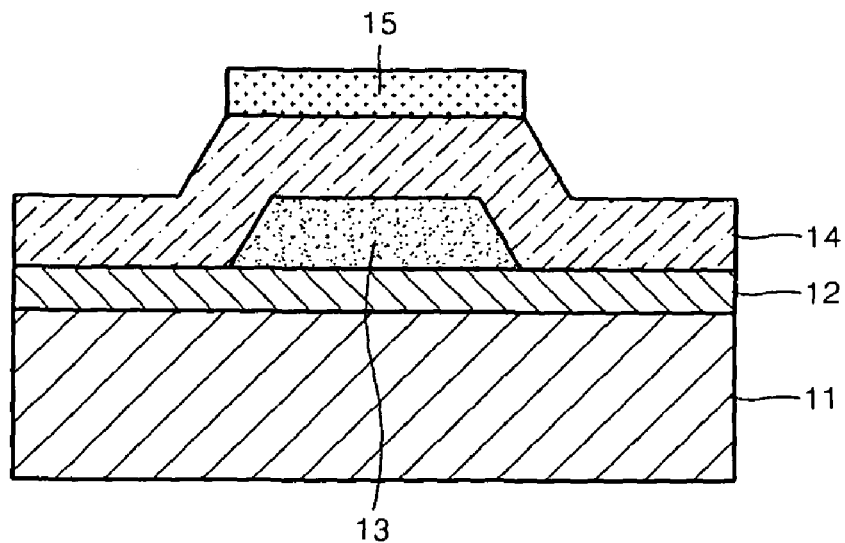

Referring to FIG. 2B, a gate 13 may be formed by patterning the conductive material 13a. Referring to FIG. 2C, a gate insulating layer 14 may be formed by applying and patterning an insulating material (not shown) on the gate 13. The gate insulating layer 14 may be formed of, for example, a silicon oxide, a silicon nitride, a hafnium (Hf) oxide, and/or an aluminum oxide. For example, the gate insulating layer 14 may be formed of a mixture of a hafnium oxide and an aluminum oxide. Referring to FIG. 2D, a channel 15 may be formed by patterning a channel material (not shown) on the gate insulating layer 14. The channel material may be applied using, for example, physical vapor deposition (PVD), chemical vapor deposition (CVD), and/or atomic layer deposition (ALD). The channel material may be patterned so that the channel material remains on the gate insulating layer 14 in correspondence to the gate 13 to form the channel 15. According to example embodiments, the channel 15 may be directly formed on a corresponding position by using, for example, a printing process.

Figure 2E:
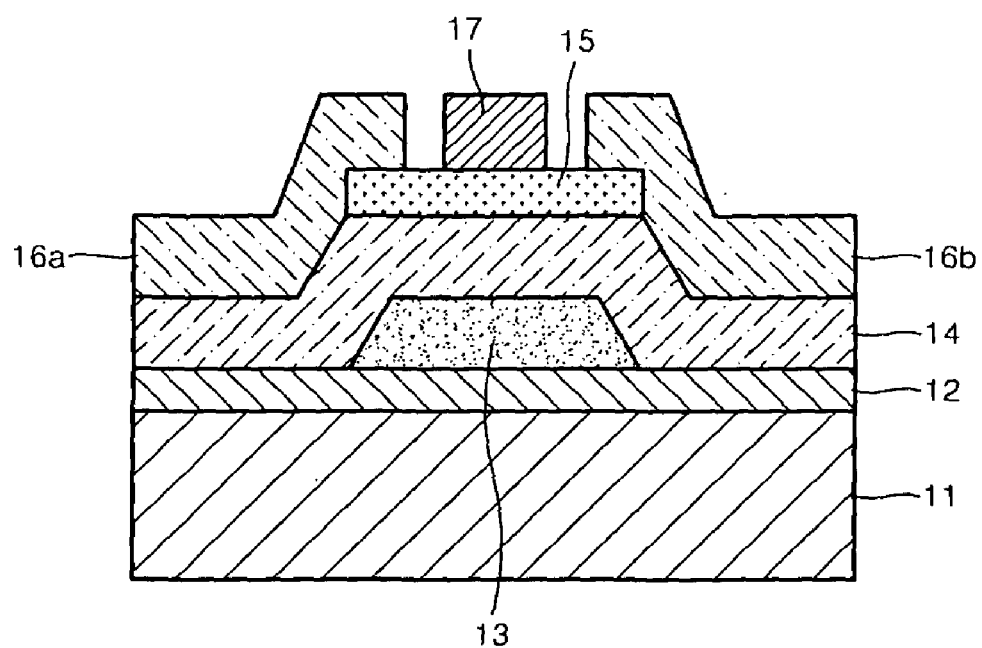

Referring to FIG. 2E, the source 16a, the drain 16b, and the floating channel 17 may be formed by applying a material (e.g., a metal and/or a conductive metal oxide) on the channel 15 and the gate insulating layer 14, and patterning the material (not shown). The floating channel 17 may be formed of the same material as that of the source 16a and the drain 16b, and the floating channel 17 may be formed in the same patterning process used to form the source 16a and the drain 16b. A heat treatment (not shown) may be performed by using, for example, a general furnace, rapid thermal annealing (RTA), laser annealing, and/or a hot plate. The heat treatment may be performed at a temperature of less than about 400° C. (e.g., about 300° C.).

Figure 3:
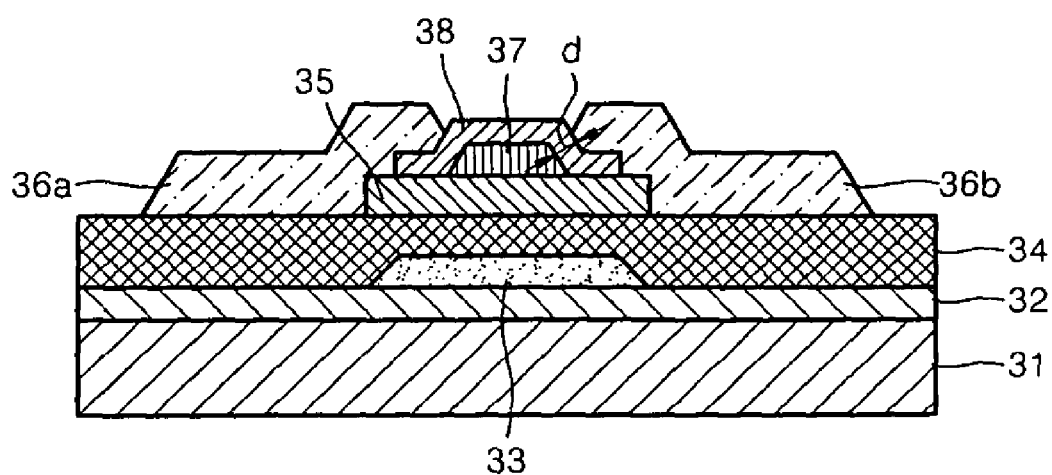

FIG. 3 is a cross-sectional diagram illustrating TFTs according to other example embodiments. Although a TFT illustrated in FIG. 3 is a bottom gate structure, example embodiments are not limited to bottom gate TFTs. TFTs according to example embodiments may be various configurations. For example, example embodiments may include top gate TFTs. Referring to FIG. 3, a gate 33 may be at least partially on a substrate 31. A gate insulating layer 34 may be on the substrate 31 and the gate 33. A channel 35 may be at least partially on the gate insulating layer 34. For example, the channel layer 35 may be on the gate insulating layer 34 in correspondence with (e.g., aligned with) the gate 33. A source 36a and a drain 36b may be on the gate insulating layer 34 and on two side regions (e.g., ends) of the channel 35. A floating channel 37 may be on a surface of the channel 35. A width of the floating channel 37 may be less than a width of the channel 35. The floating channel 37 may be spaced apart from the source 36a and the drain 36b by a distance 'd'. An oxide layer 32 may be on a surface of the substrate 31 (e.g., a silicon substrate 31). For example, the oxide layer 32 may include a dry and/or wet thermal oxide (e.g., $SiO_2$).

The distance 'd' between the floating channel 37 and the source 36a or between the floating channel 37 and the drain 36b may be about several to about several hundreds of nanometers. An insulating layer 38 may be on the floating channel 37. The insulating layer 38 may be between the channel 37 and the source 36a and/or the drain 36b. At least one of the source 36a and the drain 36b may contact end portions of the channel 35 and the insulating layer 38. The distance 'd' between the floating channel 37 and the source 36a and/or the drain 36b may substantially equal to a thickness of the insulating layer 38. A distance between the floating channel 37 and the source 36a and/or the drain 36b may be determined by a thickness of the insulating layer 38 (e.g., a thickness of about several to about several hundreds of nanometers). Because a length of the channel 35 illustrated in FIG. 3 may be less than a length of the channel 15 illustrated in FIG. 1, ON current and channel mobility of the TFT illustrated in FIG. 3 may be improved with respect to ON current and channel mobility of the TFT illustrated in FIG. 1.

The substrate 31, the oxide layer 32, the gate 33, the gate insulating layer 34, the channel 35, the source 36a, the drain 36b, and the floating channel 37 illustrated in FIG. 3 may be of the same or similar materials as the substrate 11, the oxide layer 12, the gate 13, the gate insulating layer 14, the channel 15, the source 16a, the drain 16b, and the floating channel 17, respectively, described with respect to the TFT of FIG. 1. The insulating layer 38 may include an insulating material, for example, a silicon oxide, a silicon nitride, and/or a high-K material. The insulating layer 38 may include an insulating material used in a general semiconductor device.

The methods of manufacturing a TFT described with respect to FIGS. 2A-2D may be the same or similar to methods of manufacturing the TFT of FIG. 3. The floating channel 37 may be formed by applying a material (e.g., a metal and/or a conductive metal oxide) on the channel 37 and patterning the material. The insulating layer 38 may be formed by applying an insulating material (not shown) with a thickness of about several to about several hundreds of nanometers to the floating channel 37 to surround the floating channel 37. The source 36a and the drain 36b may be formed by applying a material (e.g., a metal and/or a conductive metal oxide) on the gate insulating layer 34, the channel 35, and the insulating layer 38, and patterning the material.

According to one or more example embodiments of the present invention, TFTs (e.g., oxide and/or organic TFTs) with high and/or improved mobility, high and/or improved ON current and a positive threshold values may be obtained despite increasing or maintaining a length of entire channels of the TFTs. High and/or improved current may be achieved by reducing a length of an effective channel. Various electronic devices, for example, driving transistors of flat panel display devices (e.g., liquid crystal displays (LCDs)), organic light-emitting diodes (OLED) and transistors of peripheral circuits in memory devices may be manufactured with processes of reduced complexity according to example embodiments. TFTs according to example embodiments may be a bottom gate TFT, a top gate TFT and/or various other configurations.

While example embodiments have been particularly shown and described, it will be understood by one of ordinary skill in the art that variations in form and detail may be made therein without departing from the spirit and scope of the claims.

What is claimed is:

1. A thin film transistor (TFT), comprising:
    a source;
    a drain;
    a channel between the source and drain; and
    a floating channel on the channel, the floating channel having a length less than a length of the channel and spaced apart from the source and drain;
    wherein the channel and the floating channel are made of different materials such that a resistance of the floating channel is less than a resistance of the channel in an on state.

2. The TFT of claim 1, further comprising:
    a gate on the channel; and
    a substrate, the source, drain, channel, floating channel and gate on the substrate.

3. The TFT of claim 2, further comprising:
    a gate insulating layer between the gate and the channel.

4. The TFT of claim 1, further comprising:
    an insulating layer on the floating channel.

5. The TFT of claim 4, wherein at least one of the source and the drain contacts end regions of the channel and the insulating layer.

6. The TFT of claim 4, wherein a distance between at least one of the floating channel and the source, and between the floating channel and the drain, is about equal to a thickness of the insulating layer.

7. The TFT of claim 4, further comprising a gate on the channel; and
    a gate insulating layer between the gate and the channel.

8. The TFT of claim 1, wherein the channel includes an oxide.

9. The TFT of claim 1, wherein the channel includes an organic material.

10. The TFT of claim 1, wherein the floating channel, the source, and the drain include a same conductive material.

11. The TFT of claim 1, wherein a material of the floating channel is at least one of a metal, a metal alloy, a metal oxide, an intermetallic compound, a conductive polymer, an impurity-doped semiconductor and carbon nanotubes.

12. The TFT of claim 1, wherein a resistance of the floating channel is less than a resistance of the channel in an on state.

13. A TFT, comprising:
    a substrate,
    a source and drain on the substrate;

a channel between the source and the drain;
a gate on the channel;
a gate insulating layer between the gate and the channel, and between the gate and the source and the drain; and
a floating channel on the channel, the floating channel having a length less than a length of the channel and spaced apart from the source and the drain, a charge carrier mobility in the floating channel greater than a charge carrier mobility in the channel.

14. The TFT of claim 13, further comprising:
an insulating layer on the floating channel.

15. The TFT of claim 14, wherein at least one of the source and the drain contacts end regions of the channel and the insulating layer.

16. The TFT of claim 14, wherein a distance between one of the floating channel and the source, and the floating channel and the drain, is about equal to a thickness of the insulating layer.

17. The TFT of claim 13, wherein the channel includes an oxide.

18. The TFT of claim 13, wherein the channel includes an organic material.

19. The TFT of claim 13, wherein the floating channel, the source, and the drain include a same conductive material.

20. The TFT of claim 13, wherein a resistance of the floating channel is less than a resistance of the channel in an on state.

21. A method of manufacturing a TFT, the method comprising:
forming a gate and a gate insulating layer on a substrate;
forming a channel on the substrate, the channel separated from the gate by gate insulating layer;
forming a conductive layer to cover the gate insulating layer and the channel;
forming a source and drain to contact two side regions of the channel; and
forming a floating channel on the channel, the floating channel having a length less than a length of the channel and spaced apart from the source and the drain,
wherein the channel and the floating channel are made of different materials such that a resistance of the floating channel is less than a resistance of the channel in an on state.

22. The method of claim 21, wherein the forming of the floating channel, and the forming of the source and drain, include forming the floating channel, the source and the drain of a same conductive material in a same patterning process.

23. The method of claim 21, further comprising:
forming an insulating layer between the floating channel, and the source and drain.

24. The method of claim 21, wherein the forming of the gate and the gate insulating layer includes forming the gate closer to the substrate than the channel.

25. The method of claim 21, wherein the forming of the gate and the gate insulating layer, the forming of the channel, the forming of the conductive layer, the forming of the source and drain and the forming of the floating channel are each performed at less than about 300° C.

26. The method of claim 25, wherein the forming of the channel includes forming the channel using one of a printing process and a sol-gel process.

27. The method of claim 21, wherein the forming of the channel includes forming the channel using one of atomic layer deposition, physical layer deposition and chemical vapor deposition.

28. A thin film transistor (TFT), comprising:
a source;
a drain;
a channel between the source and drain, the channel including a semiconductor material; and
a floating channel on the channel, the floating channel having a length less than a length of the channel, the floating channel spaced apart from the source and drain, the floating channel including a conductor or semiconductor material.

29. A method of manufacturing a TFT, the method comprising:
forming a gate and a gate insulating layer on a substrate;
forming a channel on the substrate, the channel separated from the gate by gate insulating layer;
forming a conductive layer to cover the gate insulating layer and the channel;
forming a source and drain to contact two side regions of the channel; and
forming a floating channel on the channel, the floating channel having a length less than a length of the channel and spaced apart from the source and the drain, a charge carrier mobility in the floating channel greater than a charge carrier mobility in the channel.

30. A method of manufacturing a TFT, the method comprising:
forming a gate and a gate insulating layer on a substrate;
forming a channel on the substrate, the channel separated from the gate by gate insulating layer;
forming a conductive layer to cover the gate insulating layer and the channel;
forming a source and drain to contact two side regions of the channel; and
forming a floating channel on the channel, the floating channel having a length less than a length of the channel, the floating channel spaced apart from the source and the drain, the floating channel including a conductor or semiconductor material.

* * * * *